United States Patent [19]
Oshima

[11] Patent Number: 5,739,701
[45] Date of Patent: Apr. 14, 1998

[54] INPUT/OUTPUT BUFFER CIRCUIT HAVING REDUCED POWER CONSUMPTION

[75] Inventor: Masayuki Oshima, Suwa, Japan

[73] Assignee: Seiko Epson Corporation, Tokyo, Japan

[21] Appl. No.: 623,002

[22] Filed: Mar. 28, 1996

[30] Foreign Application Priority Data

Mar. 30, 1995 [JP] Japan ................................. 7-074261
Mar. 25, 1996 [JP] Japan ................................. 8-094822

[51] Int. Cl.$^6$ ............................................. H03K 19/0175
[52] U.S. Cl. ......................... 326/82; 326/29; 326/56; 326/86
[58] Field of Search .......................... 326/29, 56, 57–58, 326/82–83, 86

[56] References Cited

U.S. PATENT DOCUMENTS

| | | |
|---|---|---|
| 4,617,476 | 10/1986 | Dalrymple ........................ 326/82 X |
| 4,766,336 | 8/1988 | Warner ........................... 326/86 X |
| 4,992,679 | 2/1991 | Takata et al. .................... 326/56 X |
| 5,281,865 | 1/1994 | Yamashita et al. ............... 326/56 X |
| 5,291,080 | 3/1994 | Amagasaki ...................... 326/56 X |
| 5,498,976 | 3/1996 | Hwang ............................ 326/82 X |

*Primary Examiner*—David R. Hudspeth
*Attorney, Agent, or Firm*—Oliff & Berridge, P.L.C.

[57] ABSTRACT

There are provided an input/output buffer circuit having a reduced power consumption, and an electronic equipment using these buffer circuits. An input buffer is located on an input line while an output buffer is disposed on an output line. Each of the buffers is connected to an input/output line having input/output terminals. A latch circuit is connected to the input/output line and is switched between a first ON state in which the latch circuit is latchable and a first OFF state in which an output end of the latch circuit is in high impedance by a first control signal from a first control terminal. The output buffer is switched between a second ON state in which the output buffer can output a signal and a second OFF state in which an output end of the output buffer is in high impedance by a second control signal from a second control terminal. The first and second control signals may be common, or the second control signal may be generated by delaying it relative to the first control signal at a delay circuit.

18 Claims, 15 Drawing Sheets

INPUT/OUTPUT BUFFER CIRCUIT HAVING REDUCED POWER CONSUMPTION

BACKGROUND OF THE INVENTION

1. Field of the Invention

The present invention relates to input/output buffer, output buffer circuits having latch circuits and an electronic equipment using these buffer circuits.

2. Description of the Prior Art

The output buffer or input/output buffer circuit must prevent its output terminal from having a high impedance when a transistor forming the output buffer is switched off. To this end, the output buffer or input/output buffer circuit includes a pull-up or pull-down resistor used to set its output terminal at VDD or VSS voltage.

However, the pull-up or pull-down resistor will permit an unnecessary current to flow therethrough when the output buffer or input/output buffer circuit is in its output state.

To overcome such a problem, the output buffer or input/output buffer circuit of the prior art included a constant-operating latch circuit for providing an output hold function to the output buffer or input/output buffer circuit, as shown in FIG. 17.

Since the latch circuit is constantly operating, such an output buffer or input/output buffer circuit will still permit a current to pass through the latch circuit when the output buffer or input/output buffer circuit is in its output state and if the output voltage thereof varies.

For example, when the control terminal in an input/output buffer circuit shown in FIG. 17 receives VSS voltage (which will be simply called "L" hereinafter) in the output state thereof and if "L" at the OUT terminal thereof is changed to VDD voltage (which will be simply called "H" hereinafter), the "L" data held and outputted by a latch circuit 1004 may collide with the "H" data outputted from an output buffer 1003 of an input/output circuit 1001 on an input/output line so that a current will undesirably flow from a VDD power source through a P-channel transistor in the output buffer 1003 via an N-channel transistor in an output inverter 1006 of the latch circuit 1004 to a VSS power source. Such a current continues to flow until the voltage at the X terminal reaches a level equal to or higher than the logic level of an input inverter 1005 and also until the voltage held by the input inverter 1005 has inverted from "H" to "L".

Even when the voltage at the OUT terminal is changed from "H" to "L", a current will similarly flow from the VDD power source to the VSS power source through the P-channel transistor of the output inverter 1006 via the N-channel transistor of the output buffer 1003.

SUMMARY OF THE INVENTION

It is therefore an object of the present invention to provide input/output buffer and output buffer circuits which can control their latch circuits, and to provide an electronic equipment using these buffer circuits.

Another object of the present invention is to provide input/output buffer and output buffer circuits which can control the latch circuits depending on the state of output buffer to reduce any unnecessary current flow for reduction of the power consumption, and to provide an electronic equipment using these buffer circuits.

Still another object of the present invention is to provide input/output buffer and output buffer circuits which can control the latch circuits for reliably performing the latching operation depending on the state of output buffer, and to provide an electronic equipment using these buffer circuits.

The present invention provides an input/output buffer circuit comprising:

an input/output line having an input/output terminal at one end, the other end thereof being branched into an input line and an output line;

an input buffer located on the input line for receiving an input signal through an input end thereof;

an output buffer located on the output line for outputting an output signal through an output end thereof;

a latch circuit connected to the input/output line for latching voltages in the input and output signals to hold the voltages at an output end of the latch circuit; and a control terminal receiving a first control signal, wherein the latch circuit is responsive to the first control signal inputted thereinto through the control terminal for being switched between a first ON state in which the voltages of the input and output signals are latched by the latch circuit and a first OFF state in which the output end of the latch circuit is in high impedance.

According to the present invention, the latch circuit can be on-off controlled. When the output buffer is in its OUTPUT state and even if the output voltage varies, the latch circuit can be maintained at its first OFF state. This can prevent an unnecessary current from flowing.

According to the present invention, the control terminal can be connected to the latch and buffer circuits, as shown in FIG. 4.

According to the present invention, the control terminal can comprise a first control terminal connected to the latch circuit for receiving a first control signal and a second control terminal connected to the output buffer for receiving a second control signal, as shown in FIG. 1. In such a case, the output buffer can be switched between a second ON state in which the output signal is outputted from the output buffer and a second OFF state in which the output end of the output buffer is in high impedance, in response to the second control signal.

A delay circuit may be located between the control terminal and the output buffer, as shown in FIG. 6. Such a delay circuit may generate a second control signal delayed relative to the first control signal by a given time, the second control signal being then outputted toward the output buffer.

In any event, it is preferable that when the output buffer is set at its second ON state through the second control signal, the latch circuit is set at its first OFF state through the first control signal. As described, this can prevent any unnecessary current from flowing.

It is further preferable that when the output buffer is set at its second OFF state through the second control signal, the latch circuit is set at its first ON state through the first control signal. In such a case, the input buffer can be ready for reception of an input signal, the voltage of such an input signal being then latched by the latch circuit.

It is further preferable that immediately before the output buffer is switched from its second ON state to its second OFF state through the second control signal, the latch circuit is switched from its first OFF state to its first ON state through the first control signal (see FIG. 3).

Thus, a first time period T1 can be set for which the first and second ON states are simultaneously attained. An output voltage immediately before the input/output buffer circuit is switched from its output state to its input state can be reliably latched by the latch circuit during the first time period T1.

When a delay circuit is used, the latch circuit may be switched from its first ON state to its first OFF state in response to the first control signal immediately before the output buffer is switched from its second OFF state to its second ON state in response to the second control signal (see FIGS. 8A and 8B). This can set a second time period T2 for which the first and second OFF states are simultaneously attained. In such a case, it is preferred that the delay circuit is used to set the second time period T2 shorter than the first time period T1 (see FIG. 10).

When a delay circuit is used, the latch circuit may be switched from its first ON state to its first OFF state in response to the first control signal immediately after the output buffer has been switched from its second OFF state to its second ON state in response to the second control signal.

This can also set a second time period T2 for which the first and second ON states are simultaneously attained. In such a case, the voltage of the input/output terminal can be fixed to the voltage in the output inverter when the input/output buffer circuit is shifted from its input state to its output state. Therefore, the input/output terminal can be prevented from being placed in its electrically floating state during the second time period T2.

The latch circuit may comprise an input inverter having first input and output ends, the first input end being connected to the input/output line; and an output inverter having second input and output ends, the second input end being connected to the first output end of the input inverter, the second output end being connected to the input/output line as an output end of the latch circuit.

In such an arrangement, it is preferred that a delay circuit is provided between the control terminal and the output buffer (see FIGS. 6 and 7). Such a delay circuit can output a second control signal delayed relative to the first control signal by a given time toward the output buffer.

Such an arrangement may be made such that the first control signal is only inputted into the input inverter while the second control signal is inputted into both the output buffer and output inverter (see FIG. 7). Thus, the input inverter can be switched between a third ON state in which the input inverter is operable and a third OFF state in which the first output end is in high impedance, in response to the first control signal. On the other hand, the output inverter can respond to the second control signal to be switched between a fourth ON state in which the output inverter is operable and a fourth OFF state in which the second output end is in high impedance.

It is preferred that immediately before the output buffer is switched from its second ON state to its second OFF state by the second control signal, the input inverter is switched from its third OFF state to its third ON state by the first control signal (see FIG. 12).

In such a manner, a first time period T1 can be set during which the second and third ON states are simultaneously attained. Thus, an output voltage immediately before the input/output buffer circuit is switched from its output state to its input state can be reliably latched by the latch circuit during the first time period T1.

Furthermore, the input inverter is switched from its third ON state to its third OFF state by the first control signal immediately before the output inverter is switched from its fourth ON state to its fourth OFF state by the second control signal (see FIG. 12).

This can set a second time period during which the fourth ON state and third OFF state are simultaneously attained. It is also preferable in such a case that a delay circuit sets the second time period shorter than the first time period. When the output inverter is in its fourth ON state and the input inverter is in its third OFF state, the input voltage to the output inverter will undesirably float to continue the through current.

In such an arrangement, the output buffer is switched from its second OFF state to its second ON state by the second control signal while substantially at the same time the output inverter is switched from its fourth ON state to its fourth OFF state by the first control signal (see FIG. 12). Thus, the output voltage from the output inverter can be set as an input/output terminal voltage even if the output end of the output inverter is in high impedance immediately before the input/output buffer circuit is switched from its output state to its input state. As a result, the input/output terminal can be prevented from being electrically floated.

It is further preferred that immediately before the output buffer is switched from its second ON state to its second OFF state by the second control signal, the input inverter is switched from its third OFF state to its third ON state by the first control signal (see FIG. 14C).

Thus, there can be attained a first time period T1 during which the second and third ON states are simultaneously attained. Also in such a case, the output voltage from the output buffer can be reliably latched by the input inverter during the first time period T1 when the input/output buffer circuit is shifted from its output state to its input state. In addition, a through current flow can also be prevented on latching since the output inverter is in its OFF state during the second time period T2.

It is further preferable that substantially at the same time when the output buffer is switched from its second OFF state to its second ON state by the second control signal, the output inverter is switched from its fourth ON state to its fourth OFF state by the first control signal (see FIG. 14C).

Thus, a second time period T2 can be set during which the second ON state and fourth OFF state are simultaneously attained. No through current will flow since both the output ends of the output buffer and output inverter are not in their ON states during the second time period T2.

The present invention may be similarly applied to an output buffer circuit which has no input buffer.

The present invention can further provide an electronic equipment which comprises the aforementioned input/output buffer circuit and a control means for outputting and controlling a control signal toward the input/output buffer circuit. Alternatively, the electronic equipment of the present invention may comprise the aforementioned output buffer circuit and a control means for outputting and controlling a control signal toward the input/output buffer circuit. Such an electronic equipment can have a reduced power consumption and also reliably perform the output or input/output latching operation.

DETAILED DESCRIPTION OF THE PREFERRED EMBODIMENTS
(First Embodiment)

Figure 1:
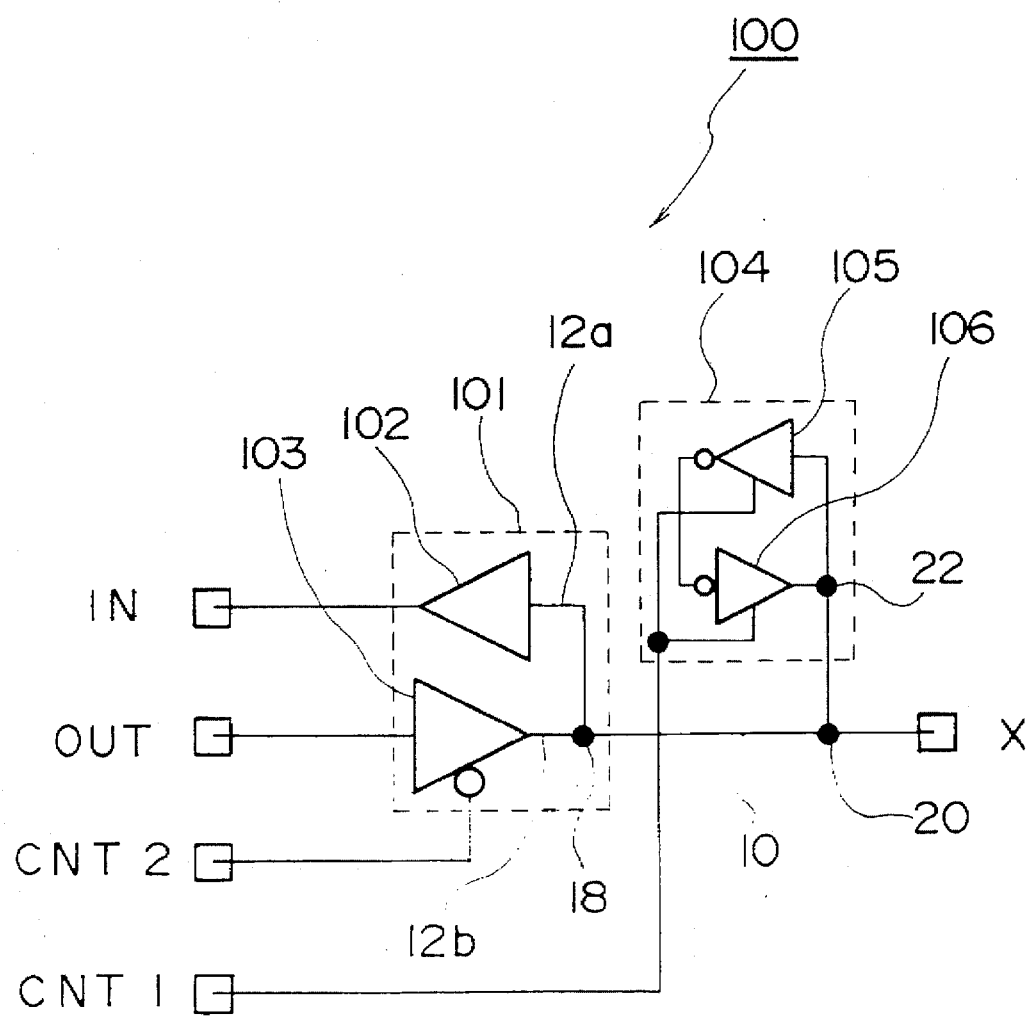
FIG. 1 is a circuit diagram of a first embodiment of the present invention which comprises an input/output buffer circuit having an output hold function.
Figure 15:
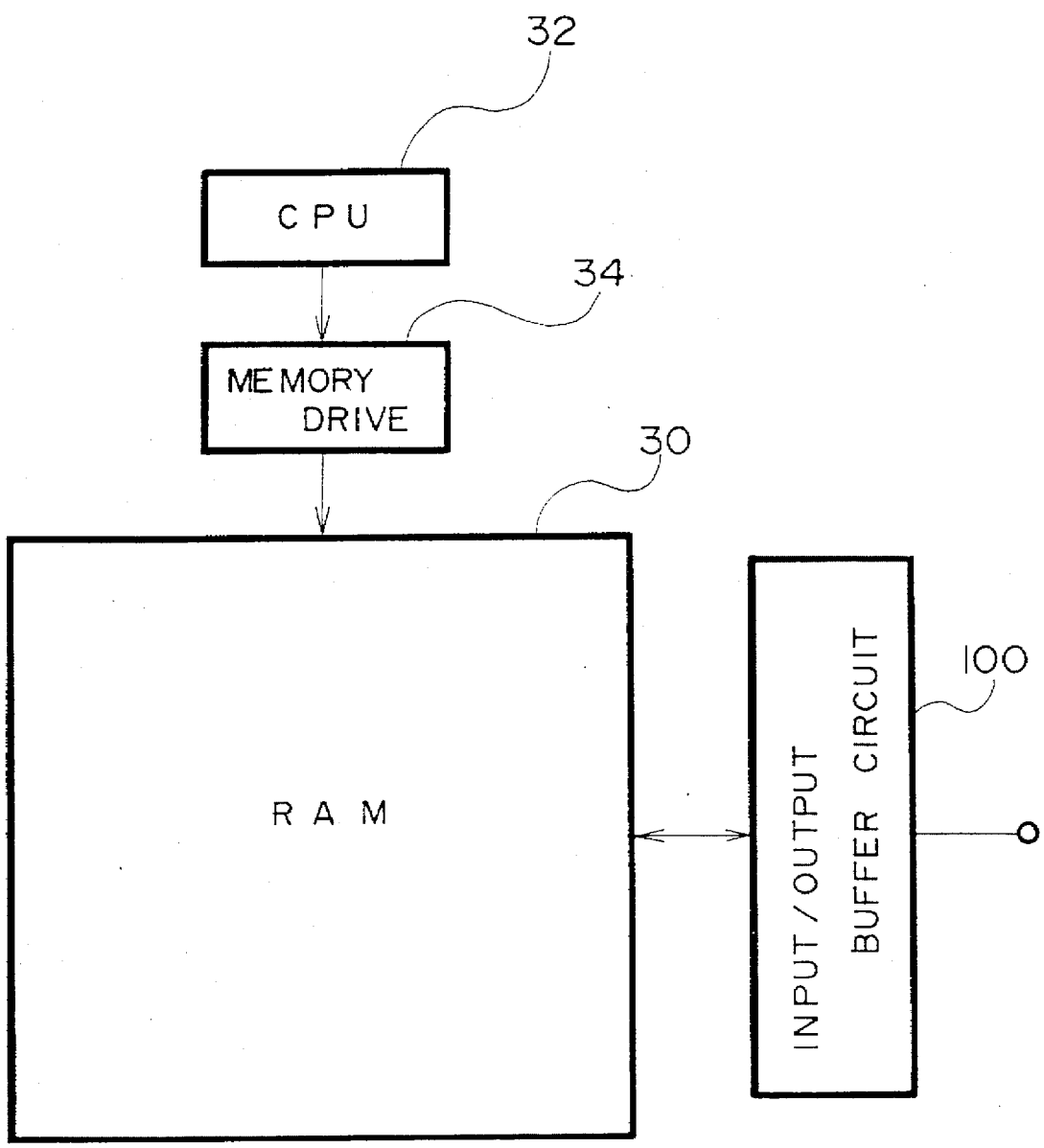
FIG. 15 is a block diagram of a memory control section in an electronic equipment according to the present invention which comprises an input/output buffer circuit.

FIG. 1 shows a circuit diagram of an input/output buffer circuit 100 having an output hold function which is a first embodiment of the present invention while FIG. 15 shows the memory control section of an electronic equipment including the input/output buffer circuit 100.

Referring first to FIG. 15, a memory element or RAM 30 is actuated by a memory drive 34 to read and write data, the memory drive 34 being controlled by a CPU 32 that is a control means. The memory drive 34 is connected to the input/output buffer circuit 100 which in turn functions as an I/O port. The input/output buffer circuit 100 is also controlled by the CPU 32.

The input/output buffer circuit 100 shown in FIG. 1 generally comprises a buffer circuit 101 and a latch circuit 104. The buffer circuit 101 has an input buffer 102 and an output buffer 103. The latch circuit 104 has an input inverter 105 and an output inverter 106. The buffer and latch circuits 101, 104 are connected to an input/output line 10.

The input/output line 10 includes, at one end, an external input/output terminal X of IC, for example. The other end of the input/output line 10 branches into an input line 12a and an output line 12b from a point 18.

The input buffer 102 is connected to the input line 12a, for example, between the internal input terminal IN of IC and the other end point 18 of the input/output line 10. On the other hand, the output buffer 103 is connected to the output line 12b, for example, between the internal output terminal OUT of IC and the other end point 18 of the input/output line 10.

Thus, the input/output terminal X functions not only as an output terminal for data outputted from the output buffer 103, but also as an input terminal for data inputted into the input buffer 102.

The input/output end of the latch circuit 104 is connected to the input/output line 10 at a point 20 on the input/output line 10. Thus, the latch circuit 104 can latch the data inputted into the input buffer 102 and also the data outputted from the output buffer 103.

The input/output buffer circuit 100 includes first and second control terminals CNT1, CNT2 which receive first and second control signals outputted from the CPU 32 shown in FIG. 15, respectively.

The output buffer 103 is controlled by the second control signal inputted into the second control terminal CNT2. For example, the voltage of the second control signal inputted into the second control terminal CNT2 becomes "L" in a mode wherein data is read out from the RAM 30. At this time, the output buffer 103 is placed in a state wherein signals can be outputted therefrom (second ON state). Under such a state, the signal from the internal output terminal OUT is transmitted to the input/output terminal X. When the voltage of the second control signal inputted into the second control terminal CNT2 is "H", the output terminal of the output buffer 103 is placed in a high-impedance state (second OFF state). At this time, the signal to the input/output terminal X can be inputted into the input buffer 102. Namely, a mode in which data can be written in the RAM 30 will be attained.

The input and output inverters 105, 106 are controlled by the first control signal inputted into the first control terminal CNT1. When the voltage of the first control signal inputted into the first control terminal CNT1 is "L", a point 22 connected to the input end of the input inverter 105 and also the output end of the output inverter 106 becomes high impedance (first OFF state). On the other hand, when the voltage of the first control signal inputted into the first control terminal CNT1 is "H", the input and output inverters 105, 106 are placed in their operative state (first ON state). Thus, the voltage of the input/output terminal X will be held by the latch circuit 104.

Figure 2:
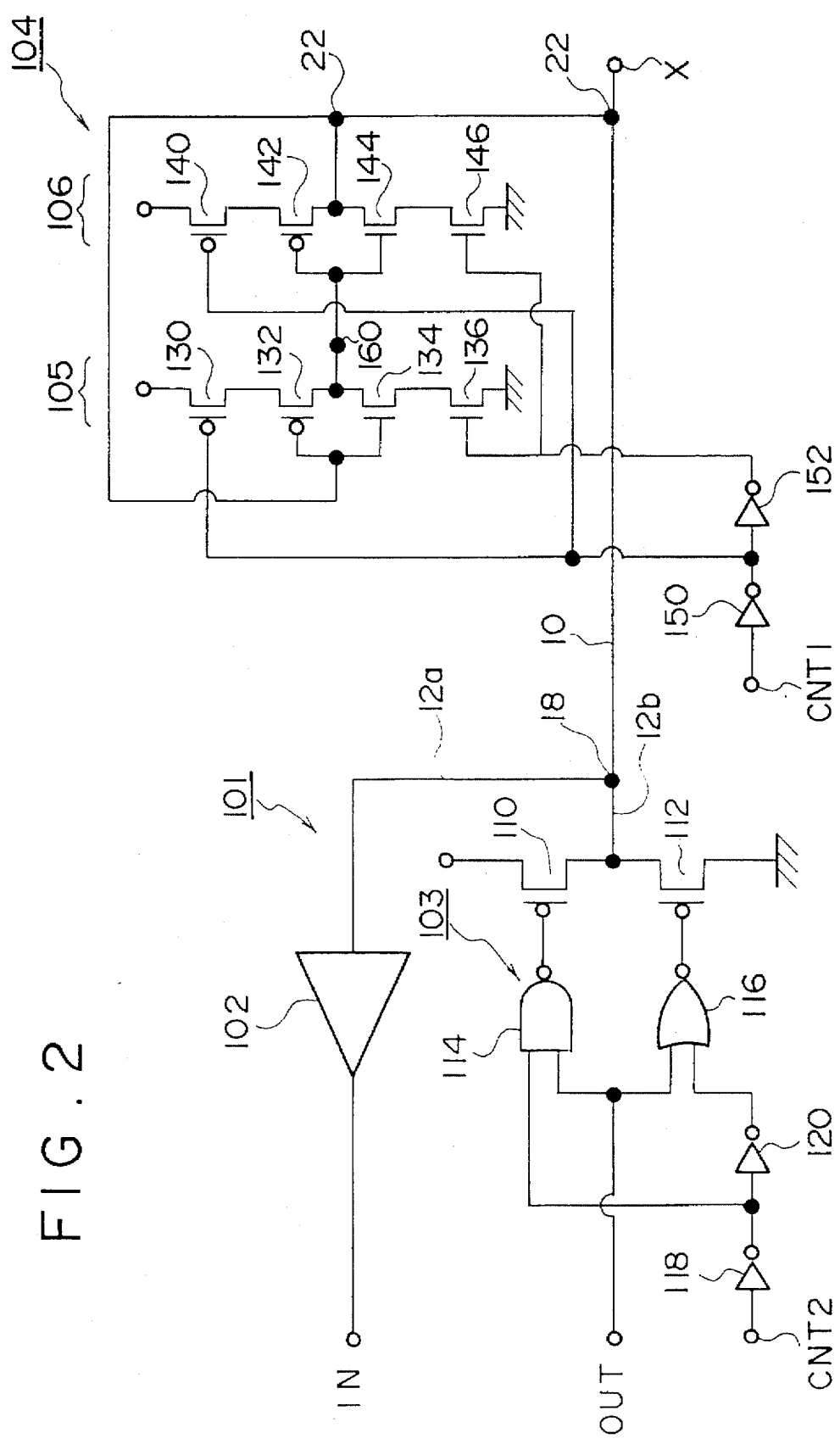
FIG. 2 is a circuit diagram of an output buffer and latch circuit shown in FIG. 1.

FIG. 2 is a circuit diagram of buffer and latch circuits 101, 104 which are usable in the present invention. Referring now to FIG. 2, the output buffer 103 includes a P-channel transistor 110 and an N-channel transistor 112, all of which define a CMOS transistor. The gate of the P-channel transistor 110 is connected to a NAND gate circuit 114 while the gate of the N-channel transistor 112 is connected to a NOR gate circuit 116. Each of the NAND and NOR gate circuits 114, 116 includes two input terminal, one of which is connected to the internal output terminal OUT.

The other input terminal of the NAND gate circuit 114 receives the second control signal to the second control terminal CNT2 after it has been inverted by an inverter 118. The other input terminal of the NOR gate circuit 116 receives the second control signal to the second control terminal CNT2 after it has been inverted by inverters 118 and 120.

When the voltage at the second control terminal CNT2 is "H", therefore, the "H" is always applied to the gate of the P-channel transistor 110 to place the P-channel transistor 110 in its OFF state. The "L" is always applied to the gate of the N-channel transistor 112 to place the N-channel transistor 112 in its OFF state. Thus, the output end of the output buffer 103 becomes the high-impedance state (second OFF state). As a result, the input buffer 102 can receive signals from the input/output terminal X.

On the other hand, the P-channel and N-channel transistors 110, 112 are placed in their ON or OFF state depending on the voltage at the internal output terminal OUT when the voltage of the second control terminal CNT2 is "L". Thus, the voltage at the internal output terminal OUT will be outputted directly toward the point 18 on the output side of the output buffer 103.

In such a manner, the second control signal to the second control terminal CNT2 can be used to switch the output buffer 103 between the second ON state wherein the output buffer 103 can output signals and the second OFF state wherein the output end of the output buffer 103 is placed in the high-impedance state.

Referring again to FIG. 2, the input and output inverters 105, 106 are each defined by a clocked inverter. More particularly, the input inverter 105 is formed by P-channel transistors 130, 132 and N-channel transistors 134, 136. On the other hand, the output inverter 106 is formed by P-channel transistors 140, 142 and N-channel transistors 144, 146.

The gates of the P-channel transistors 130 and 140 receive the first control signal to the first control terminal CNT1 after it has been inverted by an inverter 150. The gates of the N-channel transistors 136 and 146 receive the first control signal to the first control terminal CNT1 after it has been inverted by inverters 150 and 152.

When the voltage at the first control terminal CNT1 is "L", therefore, "H" is applied to the gates of the P-channel transistors 130 and 140 and "L" is applied to the gates of the N-channel transistors 136 and 146. Thus, the P-channel transistors 130, 140 and N-channel transistors 136, 146 will be turned off. As a result, the voltages at points 160 and 22 shown in FIG. 2 become high impedance (first OFF state).

On the other hand, when the voltage at the first control terminal CNT1 is "H", the P-channel transistors 130, 140 and N-channel transistors 136, 146 will be placed in their ON state (first ON state). Thus, the voltage at the input/output terminal X will be latched by the input and output inverters 105 and 106.

In such a manner, the first control signal to the first control terminal CNT1 can be used to switch the input and output inverters 105, 106 between the first ON state wherein the latching can be carried out by them and the first OFF state wherein the output ends of the inverters 105 and 106 are placed in their high-impedance state.

When the voltage at the second control terminal CNT 2 is "L" and if the buffer circuit 101 is in its output state (second ON state), the voltage at the first control terminal CNT1 may be "L" state while the latch circuit 104 may be in its first OFF state. Thus, no current will flow from VDD to VSS through the latch circuit 104 even if the output voltage of the output buffer 103 is changed from "L" to "H" or vice versa.

This will be described in more detail in connection with the output of the output buffer 103 when it is changed from "L" to "H", for example. Unlike this embodiment, the output inverter 106 outputs the previously held "L" and the output buffer 103 outputs a new "H" when the N-channel transistor 146 in the output inverter 106 is in its ON state. These output voltages collide with each other on the input/output line 10. Since the capacity of the output buffer 103 is set larger, actually, the "H" from the output buffer 103 will be latched by the latch circuit 104. However, an electric circuit will be formed by the P-channel transistor 110 of the output buffer 103, the N-channel transistors 144 and 146 of the output inverter 106, and the input/output line 10 until the "H" of the output buffer 103 will be latched by the latch circuit 104. Thus, an unnecessary current will flow when the voltage at the internal output terminal OUT varies. This will increase the power consumption.

This embodiment can prevent the unnecessary current from flowing under the above condition since the N-channel transistor 146 in the output inverter 106 can be turned off. When the voltage at the second control terminal CNT2 is "H" such that the buffer circuit 101 can receive input signals (the output buffer 103 is in the second OFF state), the voltage at the first control terminal CNT1 may be "H". Thus, the latch circuit 104 will be placed in its latchable state to hold the output voltage immediately before the buffer circuit 101 is switched to its input receivable state. Even if there is no input signal from the external IC, therefore, the voltage at the input/output terminal X can be fixed to the output voltage of the output inverter 106. Thus, the input/output terminal X can be prevented from electrically floated.

Figure 3:
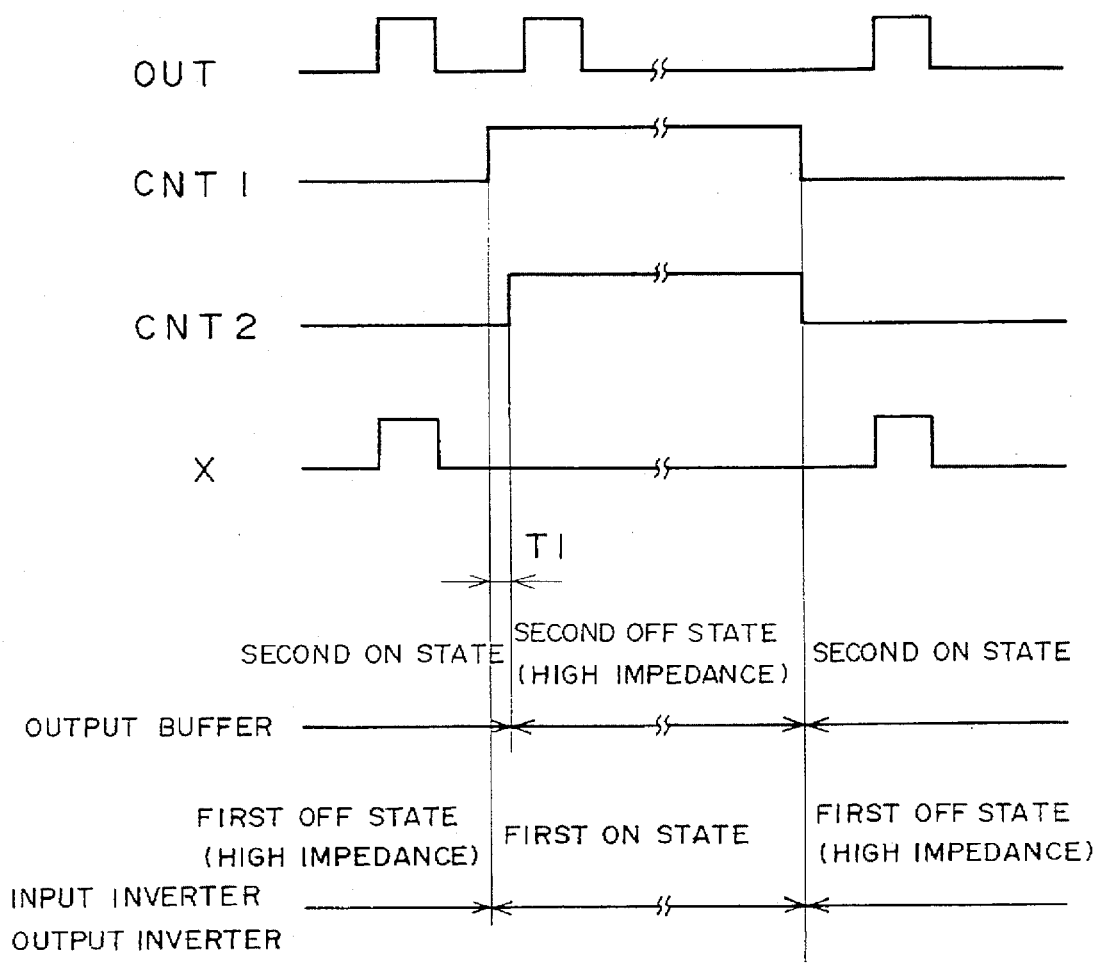
FIG. 3 is a timing chart illustrating the operation of the input/output buffer circuit shown in FIG. 1.

The above control can be carried out, for example, according to such a timing chart as shown in FIG. 3.

In FIG. 3, the rise of the first control signal to the first control terminal CNT1 is set earlier than the rise of the second control signal to the second control terminal CNT2 by a first time period T1. Thus, all the output buffer 103, input and output inverters 105, 106 will be turned on only for a slight time period immediately before the buffer circuit 101 is placed in its input receivable state (the output buffer 103 is in the second OFF state). As a result, the output voltage from the output buffer 103 immediately before the buffer circuit 101 is switched to its input receivable state can be reliably latched by the latch circuit 104.

(Second Embodiment)

Figure 4:
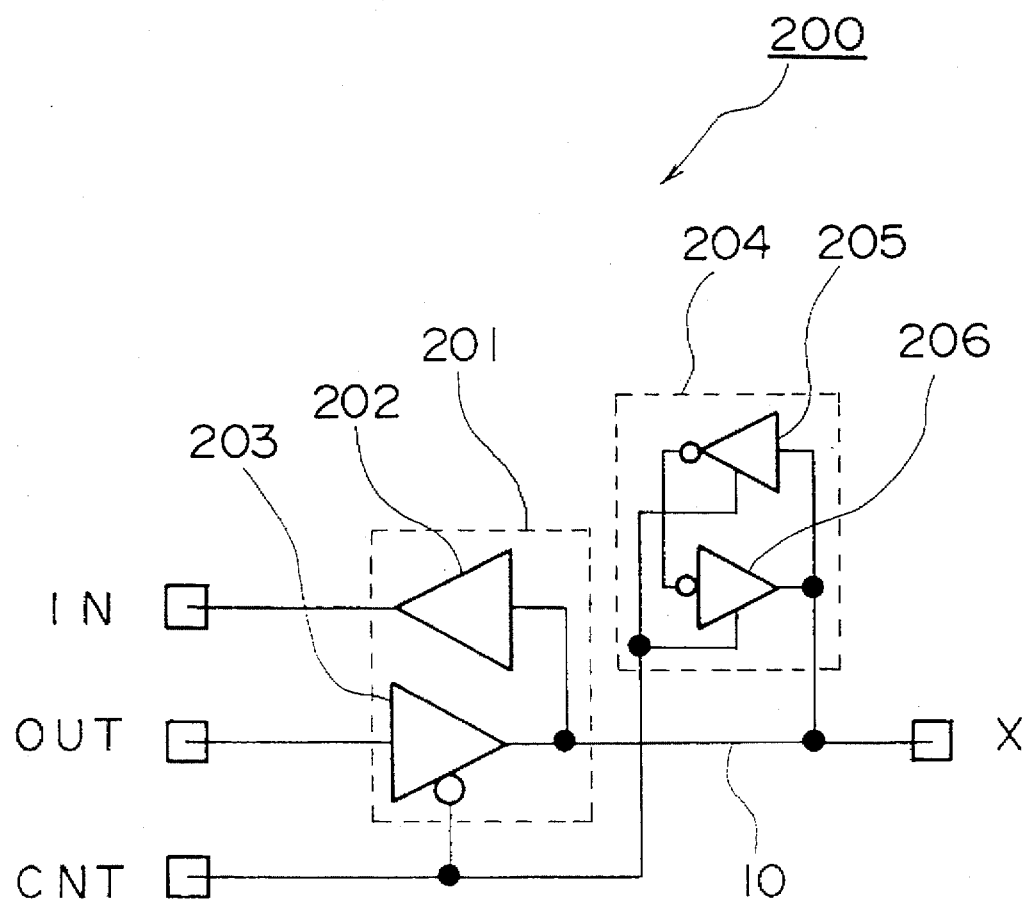
FIG. 4 is a circuit diagram of a second embodiment of the present invention which comprises another input/output buffer circuit having an output hold function.

FIG. 4 shows a circuit diagram of another input/output buffer circuit 200 having an output hold function which is a second embodiment of the present invention.

The second embodiment uses a single control signal which can be used not only as a first control signal, but also as a second control signal. In FIG. 4, thus, a single control terminal CNT is connected to the control terminal of an output buffer 203 and to the respective control terminals of input and output inverters 205, 206 of a larch circuit 204.

In such a case, when the voltage at the control terminal CNT is "L", the buffer circuit 201 is placed in its output state (the output buffer 203 is in the second ON state) and the latch circuit 204 is placed in the first OFF state. On the other hand, when the voltage at the control terminal CNT is "H", the output end of the output buffer 203 becomes high impedance. At this time, the latch circuit 204 is placed in its first ON state and therefore the voltage at the input/output terminal X will be held by the latch circuit 204. In such a manner, the control signal from the single control terminal CNT can be used to switch the output state to the input state or vice versa.

Figure 5:
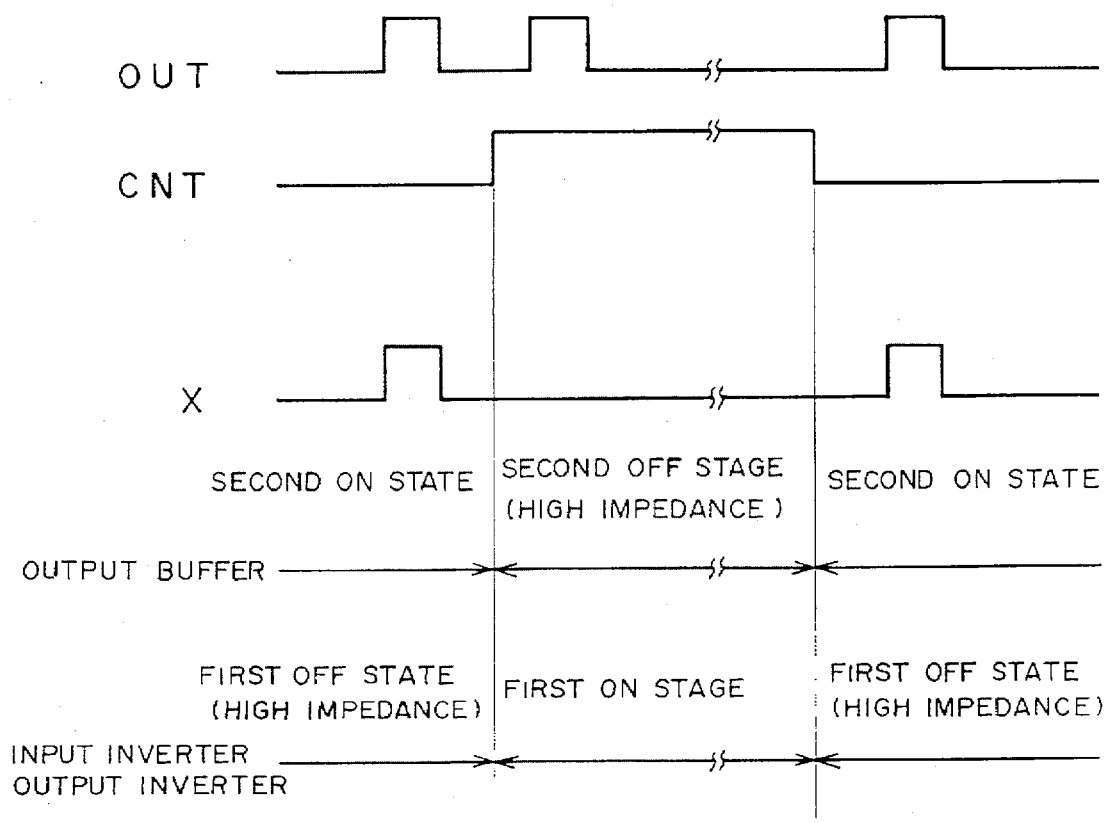
FIG. 5 is a timing chart illustrating the operation of the input/output buffer circuit shown in FIG. 4.

Such a control can be performed according to a timing chart shown in FIG. 5. Unlike the timing chart of FIG. 3, the timing chart of FIG. 5 is adapted to place the buffer circuit 201 in its input receivable state (to place the output buffer 203 in the second OFF state) and at the same time the latch circuit 204 is turned on and placed in the first ON state. Also in such a case, the output voltage from the output buffer 203 immediately before the buffer circuit 201 is switched to its input receivable state can be latched by the latch circuit 204, depending on a charge into a capacitor on the input/output line 10.

(Third Embodiment)

Figure 6:
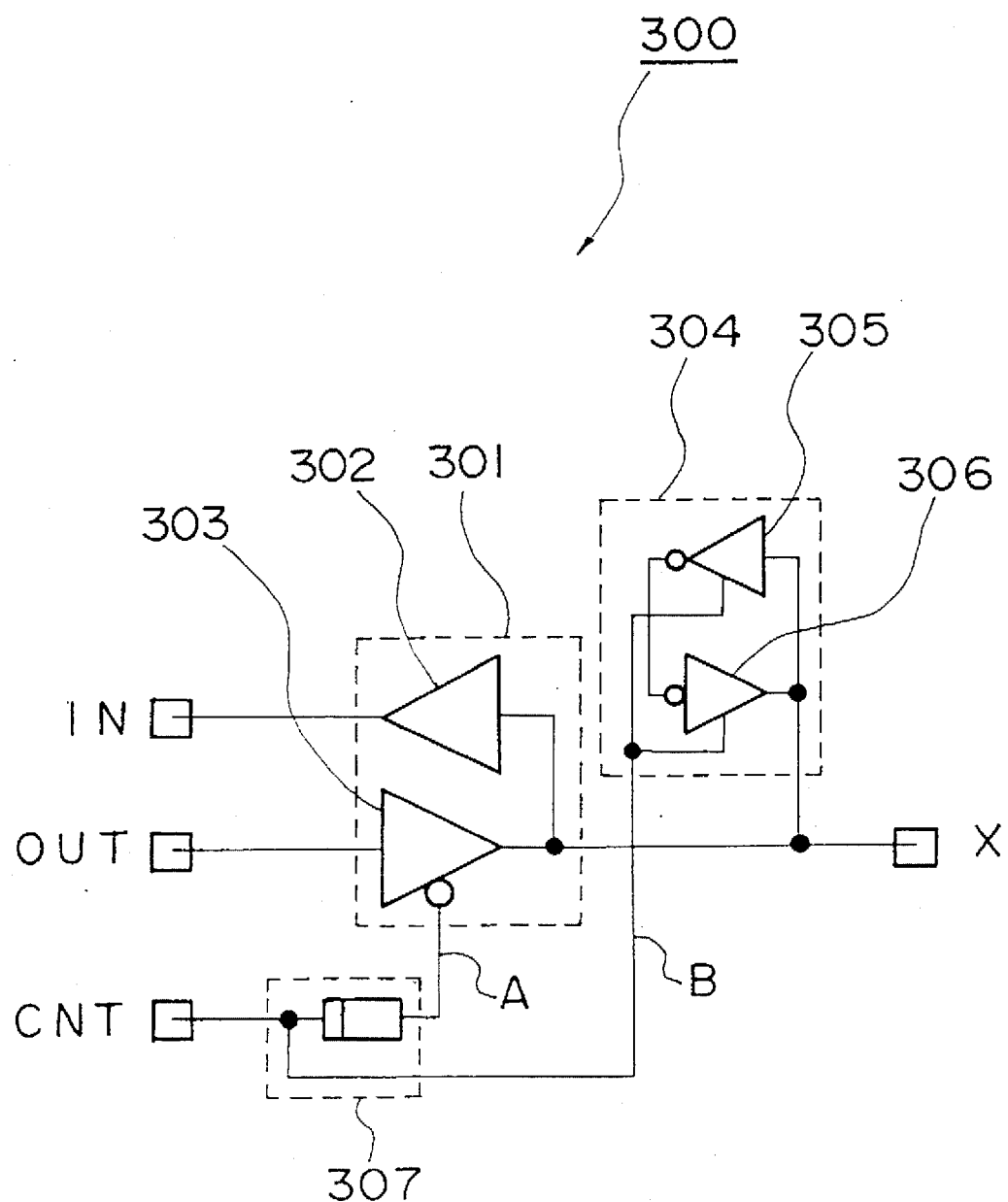
FIG. 6 is a circuit diagram of a third embodiment of the present invention which comprises a further input/output buffer circuit having an output hold function.

FIG. 6 shows a circuit diagram of still another input/output buffer circuit 300 having an output hold function which is a third embodiment of the present invention.

FIG. 6 shows a single control terminal CNT as in the embodiment of FIG. 4. Such a single control terminal CNT is connected to the respective control terminals of input and output inverters 305, 306 in a latch circuit 304, as in the embodiment of FIG. 3. The third embodiment is different from the embodiment of FIG. 4 only in that the control terminal CNT is connected to the control terminal of an output buffer 303 through a delay circuit 307.

The operation of the third embodiment will be described according to timing charts shown in FIGS. 8A and 8B.

Figure 8A:
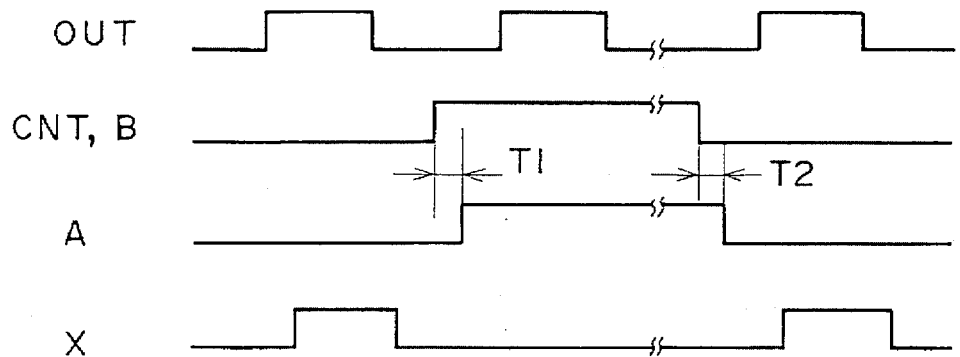
FIG. 8A is a timing chart illustrating signal waveforms in the input/output buffer circuits shown in FIGS. 6 and 7.
Figure 8B:
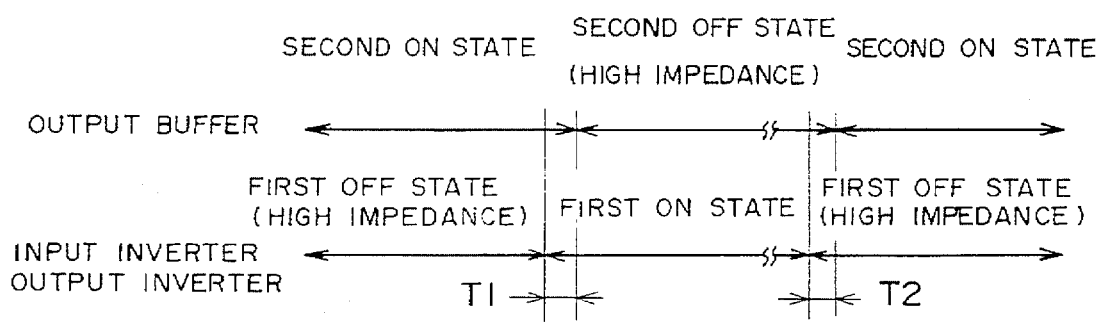
FIG. 8B is a timing chart illustrating the operation of the input/output buffer circuit shown in FIG. 6.

As shown in FIG. 8A, the second control signal at a point A shown in FIG. 6 is transmitted to the control terminal of the output buffer 303 later than the first control signal at a point B with a delay time set by the delay circuit 307. As shown in FIG. 8B, thus, all the output buffer 303 and input and output inverters 305, 306 are placed in their ON state for the first time period T1 from the rise of the first control signal to the rise of the second control signal. Therefore, the output voltage of the output buffer 303 when a buffer circuit 301 is switched to its input receivable state (the output buffer 303 is in the second OFF state) can be reliably held by the latch circuit 304.

During a second time period T2, the output ends of the input and output inverters 305, 306 are both in high impedance. This is not preferable. Such a situation can be overcome by provision of a delay circuit which decreases the second time period T2 as short as possible, as will be described later.

(Fourth Embodiment)

Figure 7:
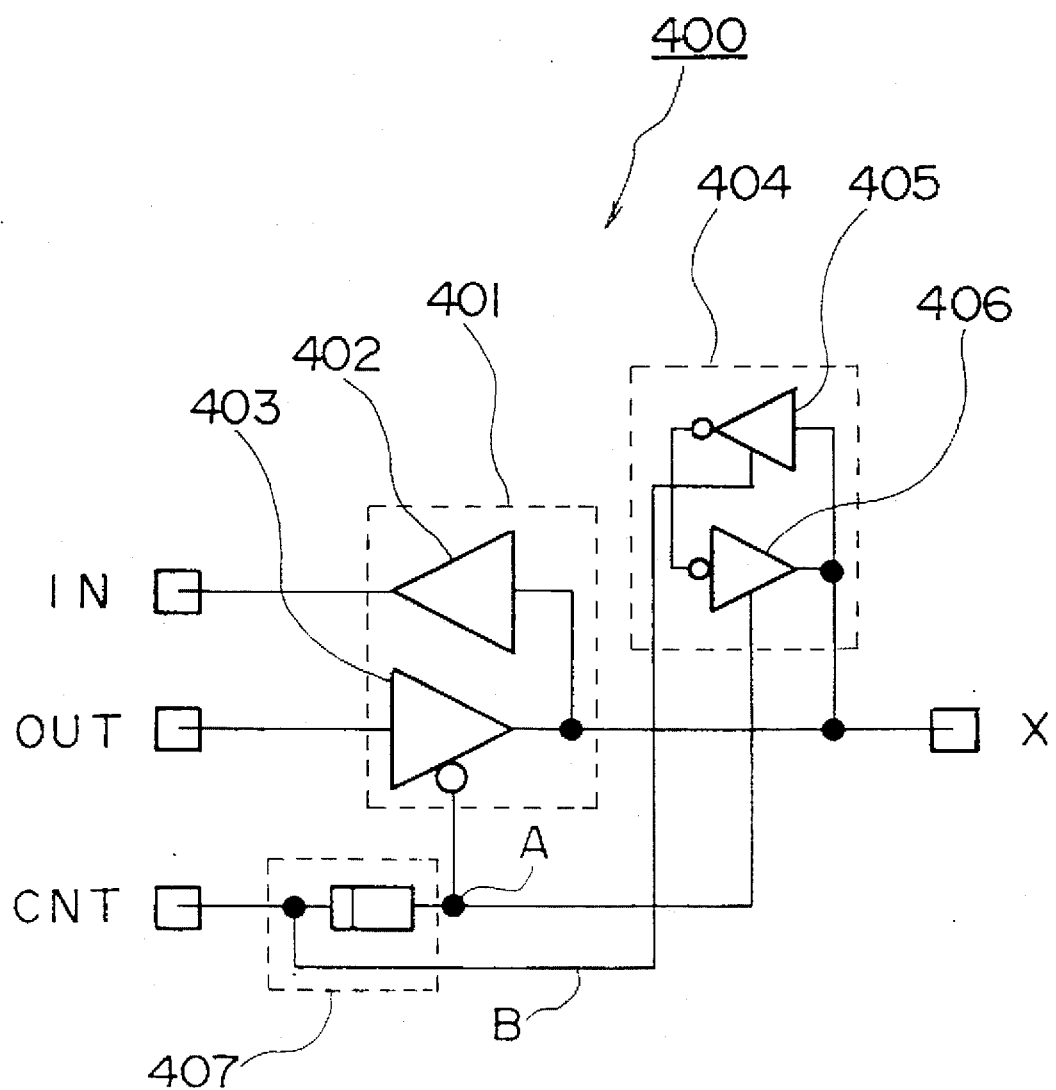
FIG. 7 is a circuit diagram of a fourth embodiment of the present invention which comprises a further input/output buffer circuit having an output hold function.

FIG. 7 shows a circuit diagram of a further input/output buffer circuit 400 having an output hold function which is a fourth embodiment of the present invention.

As shown in FIG. 7, a control terminal CNT is connected to the control terminal of an output buffer 403 and to the control terminal of an output inverter 406 in a latch circuit 404, through a delay circuit 407. The control terminal CNT is further connected directly to the control terminal of an input inverter 405 in the latch circuit 404.

A signal supplied to the control terminal of the input inverter 405 will be called "first control signal" while a signal supplied to the respective control terminals of the output buffer and inverter 403, 406 will be called "second control signal". The second control signal can be obtained by delaying the first control signal at the delay circuit 407.

Figure 8C:
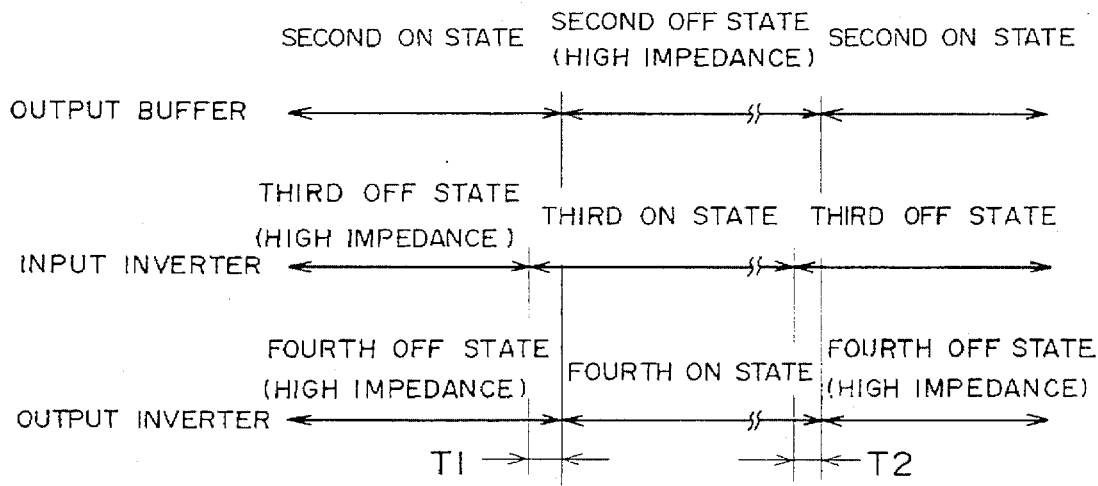
FIG. 8C is a timing chart illustrating the operation of the input/output buffer circuit shown in FIG. 7.

The operation of the fourth embodiment will be described according to timing charts shown in FIGS. 8A and 8C.

As shown in FIG. 8A, the second control signal at a point A in FIG. 7 is transmitted to the control terminals of the output buffer and inverter 403, 406 later than the first control signal at a point B in FIG. 7 with a delay time set by the delay circuit 407. As shown in FIGS. 8A and 8C, thus, the output buffer 403 and input inverter 405 are respectively placed in the second and third ON states during the first time period T1 from the rise of the second control signal to the rise of the first control signal. The output side of the output inverter 406 is in the fourth OFF state wherein it is placed in high impedance. Therefore, the output voltage of the output buffer 403 can be reliably held by the input inverter 404 in the latch circuit 404 when the buffer circuit 401 is switched to its input receivable state. During the second time period T2 from the fall of the first control signal to the fall of the second control signal, the second OFF state wherein the output end of the output buffer 403 is in high impedance is attained while the third OFF state wherein the output end of the input inverter 405 is in high impedance is provided. The output inverter 406 is placed in the fourth ON state. Therefore, the voltage at the input/output terminal X can be fixed to the output voltage of the output inverter 406 when the buffer circuit 401 is switched from its input state to its output state. As a result, the input/output terminal X can be prevented from being electrically floated.

(Fifth Embodiment)

Figure 9:
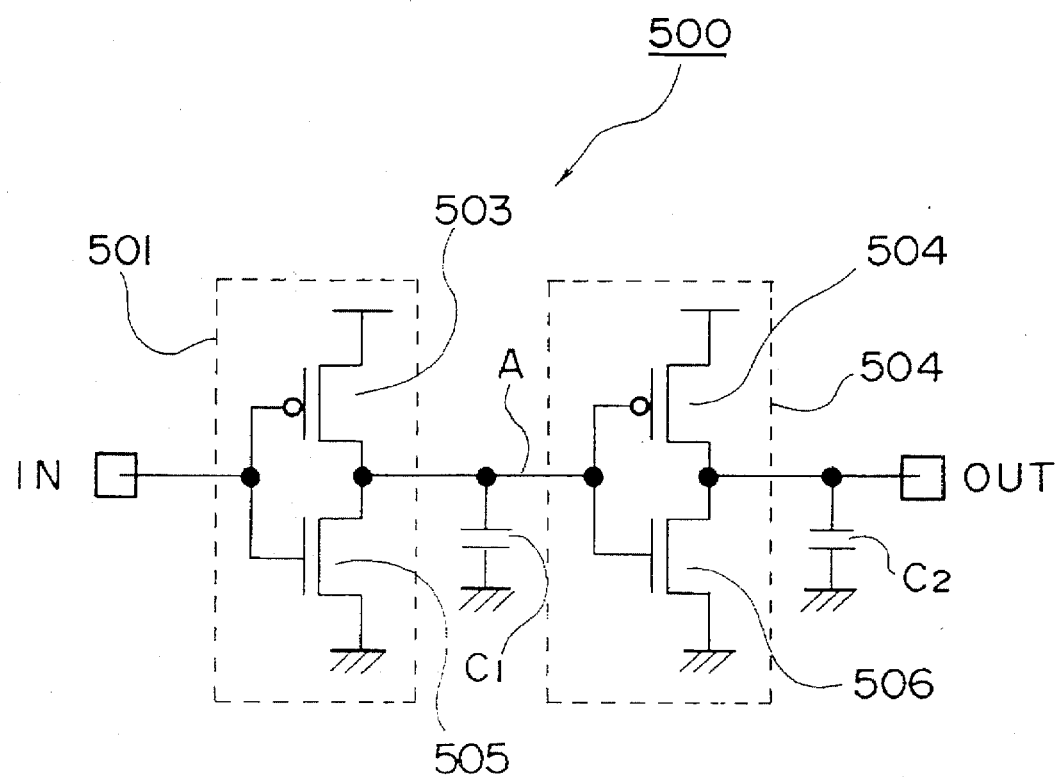
FIG. 9 is a circuit diagram of a fifth embodiment of the present invention which comprises a delay circuit.

FIG. 9 shows a circuit diagram of a delay circuit 500 which is a fifth embodiment of the present invention.

In FIG. 9, the delay circuit 500 includes a first inverter 501 and a second inverter 502. The first inverter 501 is defined by P-channel and N-channel transistors 503, 505 while the second inverter 502 is formed by P-channel and N-channel transistors 504, 506. These first and second inverters define a delay circuit for transmitting a signal from IN terminal to OUT terminal. A first capacitor C1 is located between the first and second inverters 501, 502 while a second capacitor C2 is located between the second inverter 502 and the OUT terminal.

The first inverter 501 sets $\beta$ in the P-channel transistor 503 larger and $\beta$ in the N-channel transistor 505 smaller. On the other hand, The second inverter 502 sets $\beta$ in the N-channel transistor 506 larger and $\beta$ in the P-channel transistor 504 smaller.

When $\beta$ in a P-channel transistor is larger, the capacitor in the post-stage of that transistor can be charged for a shortened time. On the contrary, smaller $\beta$ will prolong a time required to charge that transistor. If $\beta$ in an N-channel transistor is increased, a time required to discharge a capacitor in the post-stage of that transistor will be shortened. If the $\beta$ is decreased, such a time will be prolonged.

Figure 10:
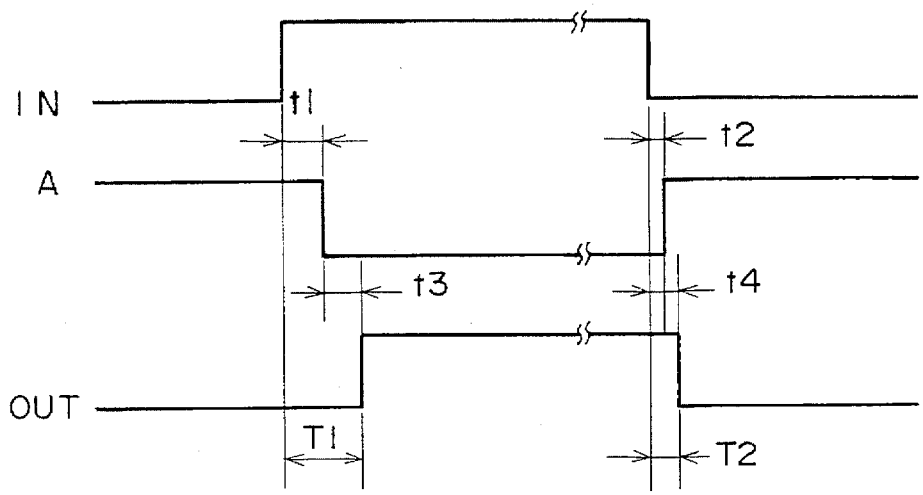
FIG. 10 is a timing chart illustrating the operation of the delay circuit shown in FIG. 9.

As a result, when the IN signal is changed from "L" to "H" as shown in FIG. 10, the voltage at a point A in FIG. 9 falls from "H" to "L" after a relatively long delay time t1. This is because time required to discharge the first capacitor C1 is relatively long since $\beta$ in the N-channel transistor 505 is smaller. When the IN signal is changed from "H" to "L", the voltage at the point A in FIG. 9 rises from "L" to "H" after a relatively short delay time t2 (<t1). This is because time required to charge the first capacitor C1 is relatively short since $\beta$ in the P-channel transistor 503 is larger.

As shown in FIG. 10, when the voltage at the point A is changed from "H" to "L", OUT signal in FIG. 9 rises from "L" to "H" after a relatively long delay time t3. This is because time required to charge the second capacitor C2 is relatively long since $\beta$ in the P-channel transistor 504 is smaller. When the voltage at the point A is changed from "L" to "H" as shown in FIG. 10, OUT signal in FIG. 9 falls from "H" to "L" after a relatively short delay time t4. This is because time required to discharge the second capacitor C2 is relatively short since $\beta$ in the N-channel transistor 506 is relatively large.

In such a manner, the first inverter 501 requires a shorter time for signal rise and a longer time for signal fall while the second inverter 502 requires a longer time for signal rise and a shorter time for signal fall. Since the logic level of the first inverter 501 approaches "H" and the logic level of the second inverter 502 approaches "L", the signal at the IN terminal is transmitted to the OUT terminal with such a delay time that a delay time (t1+t3) at the rise is longer and a delay time (t2+t4) at the fall is shorter.

Figure 11:
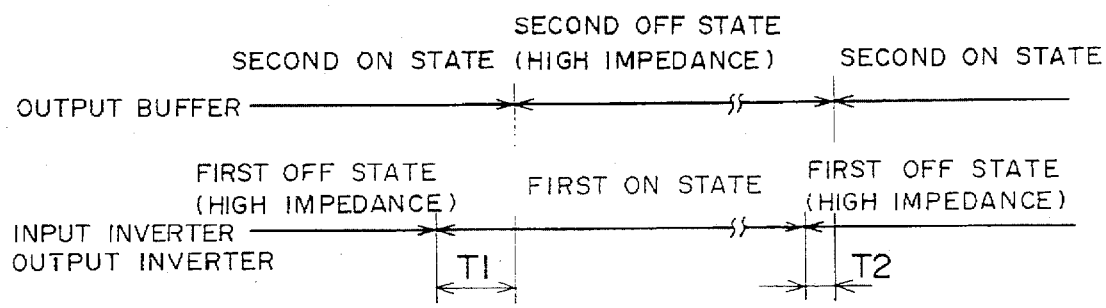
FIG. 11 is a timing chart illustrating the operation of the input/output buffer circuit shown in FIG. 6 when the delay circuit shown in FIG. 9 is used therein.
Figure 12:
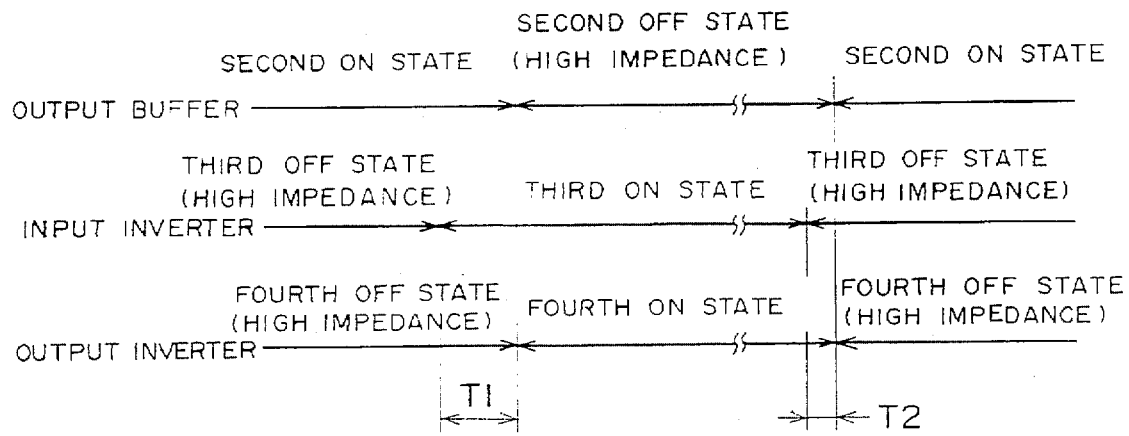
FIG. 12 is a timing chart illustrating the operation of the input/output buffer circuit shown in FIG. 7 when the delay circuit shown in FIG. 9 is used therein.

If the delay circuit 500 shown in FIG. 9 is used in place of the delay circuit 307 shown in FIG. 6 or the delay circuit 407 shown in FIG. 7, the second time period T2 can be set shorter than the first time periods T1 shown in FIGS. 11 and 12.

If the delay circuit 500 shown in FIG. 9 is used in place of the delay circuit 307 shown in FIG. 6, the input/output buffer circuit operates according to a timing chart shown in FIG. 11. According to the timing chart of FIG. 11, the output voltage from the output buffer 303 immediately before the buffer circuit 301 is switched from its output state to its input receivable state can be reliably latched by a latch circuit within the first time period T1, as in FIGS. 3 and 8B. In addition, the characteristics in the circuit can be more improved than those of FIG. 8B since the second time period T2 during which all the output buffer, input and output inverters are in high impedance can be shortened.

If the delay circuit 500 shown in FIG. 9 is used in place of the delay circuit 407 shown in FIG. 7, the input/output buffer circuit operates according the timing chart of FIG. 12. According to the timing chart of FIG. 12, the output voltage from the output buffer 403 immediately before the buffer circuit 401 is switched from its output state to its input receivable state can be reliably latched by the latch circuit 404 within the first time period T1, as in FIGS. 3 and 8C.

In FIG. 12, the output inverter 403 has been switched from the fourth ON state to the fourth OFF state by the first control signal substantially at the same time when the output buffer 403 was switched from the second OFF state to the second ON state.

Thus, the output voltage of the output inverter can be set as a voltage at the input/output terminal even if the output end of the output buffer is in high impedance immediately before the input/output buffer circuit is switched from its output state to its input state. As a result, the input/output terminal can be prevented from being electrically floated.

In addition, the second time period T2 through which the output end of the input inverter 405 is in high impedance and also the output inverter 406 is in its ON state can be shortened. This can more improve the circuit characteristics than those of FIG. 8C. In other words, the through current flow can be continued since the input voltage of the output inverter 406 is floated if the output and input inverters 406,405 are in ON and OFF states, respectively.

(Sixth Embodiment)

Figure 13A:
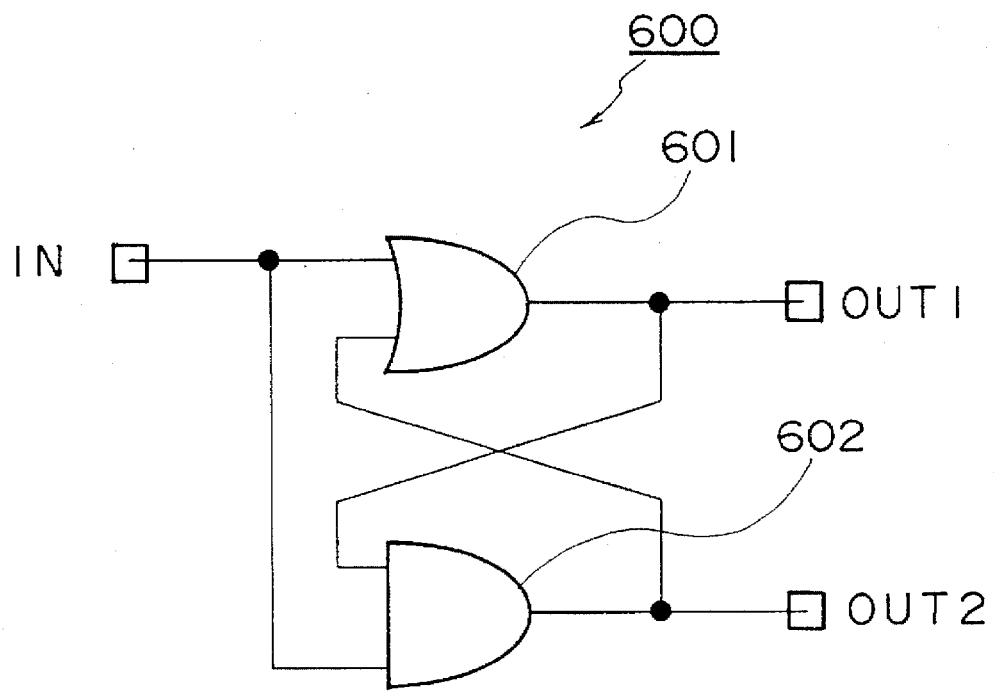
FIG. 13A is a circuit diagram of another delay circuit used in a sixth embodiment of the present invention.

FIG. 13A shows a circuit diagram of a delay circuit 600 which is a sixth embodiment of the present invention.

Referring to FIG. 13A, the delay circuit 600 is defined by an OR gate circuit 601 and an AND gate circuit 602. The output end of the OR gate circuit 601 is connected to one input terminal of the AND gate circuit 602 while the output end of the AND gate circuit 602 is connected to one input terminal of the OR gate circuit 601.

Figure 13B:
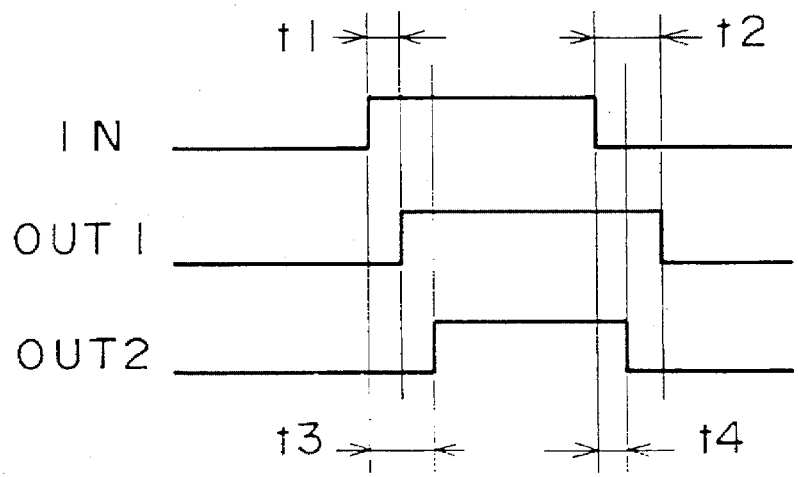
FIG. 13B is a timing chart illustrating waveforms in the delay circuit of FIG. 13A at various different points.

As shown in FIG. 13B, an output signal outputted from a terminal OUT1 rises later than the rise of an input signal inputted into a terminal IN with a delay time t1 and falls later than the fall of the input signal with a delay time t2. On the other hand, an output signal outputted from a terminal OUT2 rises later than the rise of the input signal inputted into the terminal IN with a relatively long delay time t3 (>t1) and falls later than the fall of the input signal with a relatively short delay time t4 (<t2).

Figure 14A:
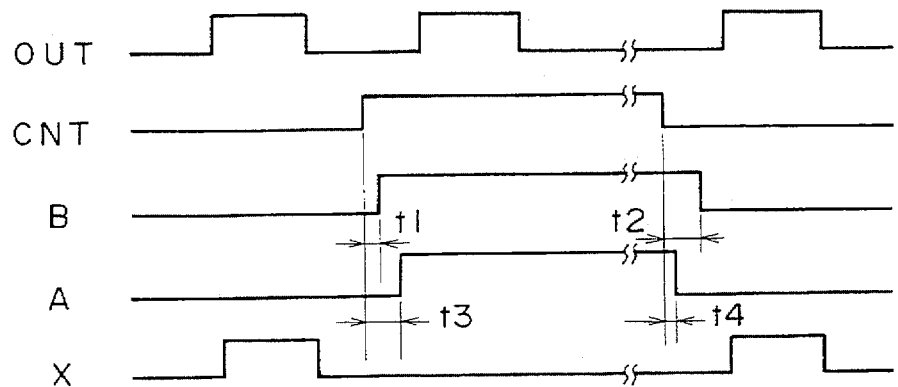
FIG. 14A is a timing chart illustrating waveforms in the input/output buffer circuits of FIGS. 6 and 7 at various different points when the delay circuit of FIG. 13A is used therein.

The delay circuit 600 shown in FIG. 13A can be used in place of the delay circuit 307 shown in FIG. 6 or the delay circuit 407 shown in FIG. 7. In such a case, the terminal OUT1 of the delay circuit 600 is connected to the point B in FIG. 6 or 7 while the terminal OUT2 of the delay circuit 600 is connected to the point A in FIG. 6 or 7. Signal waveforms of the input/output buffer circuit shown in FIG. 6 or 7 at various different points are shown as in FIG. 14A.

Figure 14B:
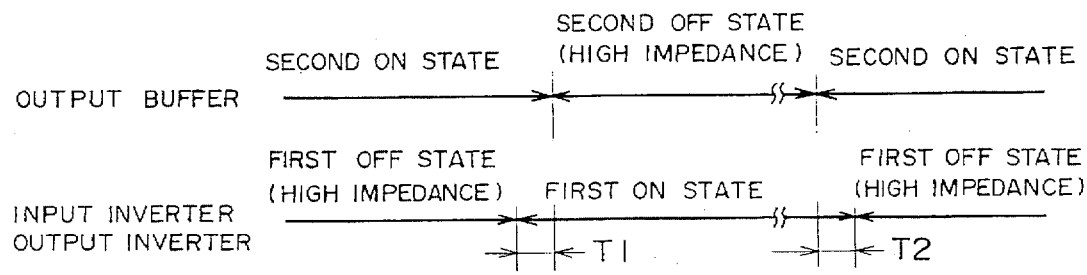
FIG. 14B is a timing chart illustrating the operation of the input/output buffer circuit shown in FIG. 6.

If the delay circuit 600 of FIG. 13A is used in place of the delay circuit 307 shown in FIG. 6, the input/output buffer circuit shown in FIG. 6 operates according to a timing chart shown in FIG. 14B. If the delay circuit 600 shown in FIG. 13A is used in place of the delay circuit 407 shown in FIG. 7, the input/output buffer circuit shown in FIG. 7 operates according to a timing chart shown in FIG. 14C.

In FIG. 14B, all the output buffer 303, input and output inverters 305, 306 are in their ON state only during the first time period T1 (t3–t1) when the buffer circuit 301 is shifted to its input receivable state, or only during the second time period T2 (t2–t4) when the buffer circuit 301 is shifted to its output state. Thus, the output voltage from the output buffer 303 when the buffer circuit 301 is switched to its input receivable state can be reliably held by the latch circuit 304. In addition, the voltage at the input/output terminal X can be fixed to the output voltage of the output inverter 306 when the buffer circuit 301 is switched from its input state to its output state. Thus, the input/output terminal X can be prevented from being electrically floated.

Figure 14C:
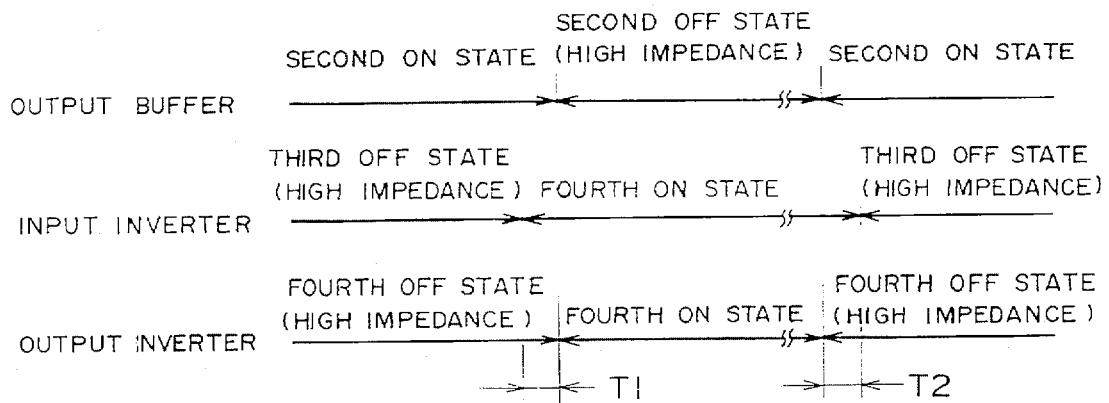
FIG. 14C is a timing chart illustrating the operation of the input/output buffer circuit shown in FIG. 7.

In FIG. 14C, the output buffer 403 and input inverter 405 are turned on only during the first time period T1 (t3–t1) when the buffer circuit 401 is shifted to its input receivable state. Therefore, the output voltage from the output buffer 403 when the buffer circuit 401 is switched to its input receivable state can be reliably held by the latch circuit 404. In addition, a so-called through current will not flow through transistors defining the latch circuit 404 since the output end of the output inverter 406 is in high impedance during the first time period T1. Even if the input inverter 405 is thereafter turned on, the output ends of the output buffer and inverter 403, 406 will not be in high impedance. This also prevents the through current from flowing.

Even during the second time period T2 of FIG. 14C, the output end of the output inverter 406 is in high impedance when the output buffer 403 is in its ON state. This also prevents a so-called through current from flowing through the transistors that define the latch circuit 404.

The present invention is not limited to the aforementioned embodiments, but may be applied in any of various different forms within the scope of the present invention.

Figure 16:
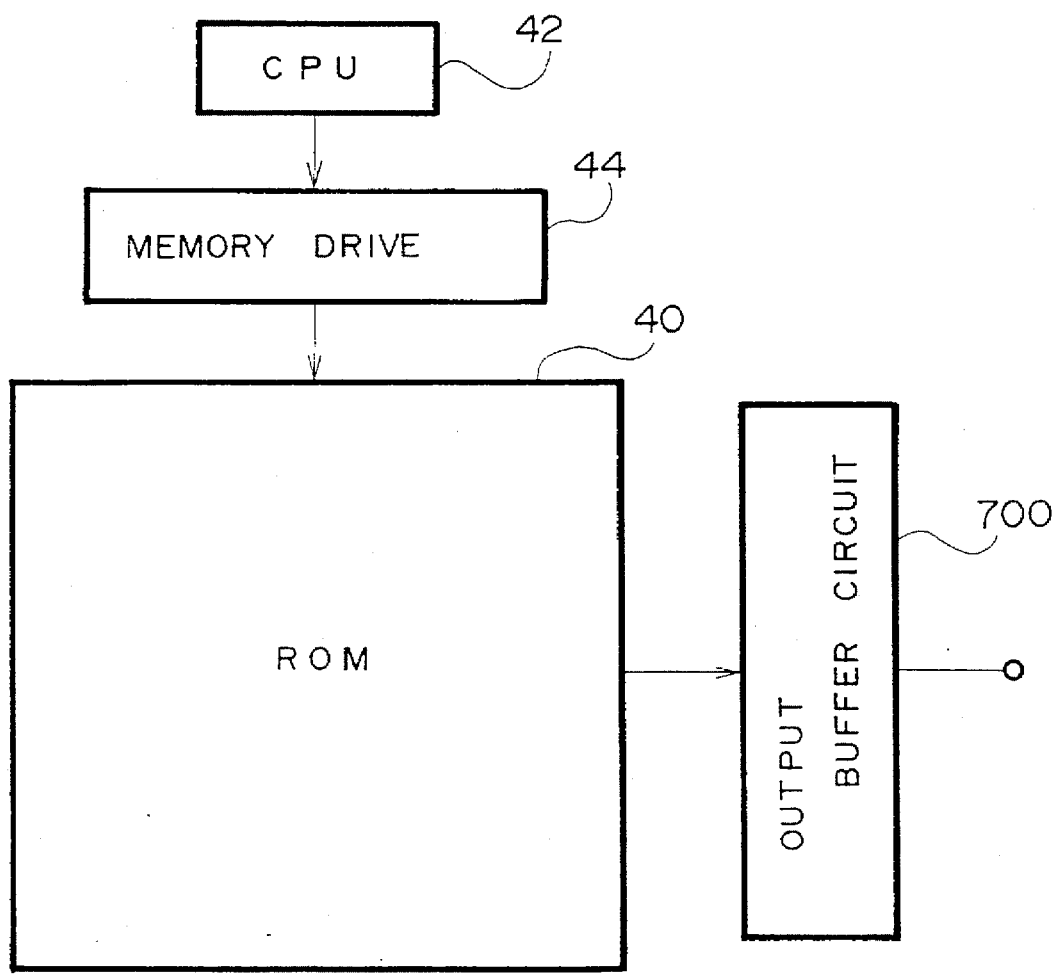
FIG. 16 is a block diagram of a memory control section in an electronic equipment according to the present invention which comprises an output buffer circuit.
Figure 17:
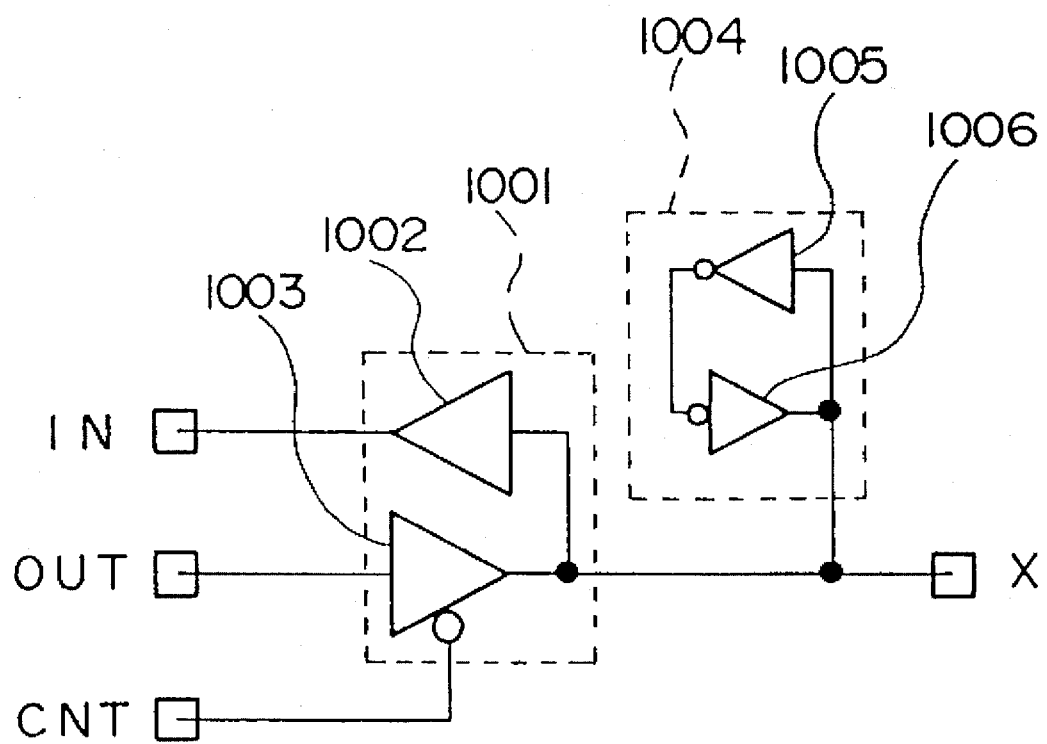
FIG. 17 is a circuit diagram of an input/output buffer circuit having an output hold function which is made according to the prior art.

Although the embodiments of the present invention have been described as to the input/output buffer circuits, the present invention can be similarly applied to an output buffer circuit. In this case, the input buffers used in the aforementioned embodiments of the present invention may be omitted. FIG. 16 is a block diagram of a memory control section in an electronic equipment that includes an output buffer circuit 700 according to the present invention. Referring to FIG. 16, a memory element or ROM 40 is actuated by a memory drive 44 controlled by CPU 42 being control means to read data. The memory drive 44 is connected to the output buffer circuit 700. The output buffer circuit 700 is also controlled by the CPU 42.

The present invention is not limited to a buffer circuit in which it is placed in its output state when the voltage at a terminal CNT becomes "L" and in which the output end of the buffer circuit becomes high impedance when the voltage at the terminal CNT becomes "H". Similarly, the present invention is not limited to a latch circuit in which the output end thereof becomes high impedance when the voltage at the terminal CNT becomes "L" and in which the latch circuit is turned on when the voltage at the terminal CNT becomes "H". The present invention can use such buffer and latch circuits which similarly operates according to a logic inverse to the aforementioned logic.

Although the latch circuit of FIG. 2 uses a clocked inverter as an input inverter, it may be replaced by NAND and NOR gate circuits.

Although the delay circuit of FIG. 9 has been described to use a two-stage inverter, the number of the inverters may be increased in a unit of even number if the logic outputted from the final stage will not be inverted (i.e., the output being inverted relative to the input). For a purpose of delaying signals, the number of the inverters of the delay circuit may be any odd number without any problem if the output circuit operates in an appropriate manner even though the output logic is inverted.

What is claimed is:

1. An input/output buffer circuit comprising:

an input/output line having an input/output terminal at one end, the other end thereof being branched into an input line and an output line;

an input buffer located on said input line for receiving an input signal through an input end thereof;

an output buffer located on said output line for outputting an output signal through an output end thereof;

a latch circuit connected to said input/output line for latching voltages in said input and output signals to hold said voltages at an output end of said latch circuit;

a control terminal receiving a first control signal; and a delay circuit connected between said control terminal and said output buffer, said delay circuit outputting a second control signal toward said output buffer later than said first control signal with a given delay time, wherein said latch circuit is responsive to said first control signal inputted thereinto through said control terminal for being switched between a first ON state in which said voltages of said input and output signals are latched by said latch circuit and a first OFF state in which the output end of said latch circuit is in high impedance, and wherein said output buffer is switched by said second control signal between a second ON state in which said output signal is outputted therefrom and a second OFF state in which the output end of said output buffer is in high impedance.

2. The input/output buffer circuit as defined in claim 1, wherein said latch circuit is set in said first OFF state by said first control signal when said output buffer is set in said second ON state by said second control signal.

3. The input/output buffer circuit as defined in claim 1, wherein said latch circuit is set in said first ON state by said first control signal when said output buffer is set in said second OFF state by said second control signal.

4. The input/output buffer circuit as defined in claim 1, wherein said latch circuit is switched from said first OFF state to said first ON state by said first control signal immediately before said output buffer is switched from said second ON state to said second OFF state by said second control signal, to set a first time period for which said first and second ON states are simultaneously attained, and wherein said latch circuit is switched from said first ON state to said first OFF state by said first control signal immediately before said output buffer is switched from said second OFF state to said second ON state by said second control signal, to set a second time period for which said first and second OFF states are simultaneously attained.

5. The input/output buffer circuit as defined in claim 4, wherein said delay circuit delays said second control signal relative to said first control signal such that said second time period is set to be shorter than said first time period.

6. The input/output buffer circuit as defined in claim 1, wherein said latch circuit is switched from said first OFF state to said first ON state by said first control signal immediately before said output buffer is switched from said second ON state to said second OFF state by said second control signal, to set a first time period for which said first and second ON states are simultaneously attained, and wherein said latch circuit is switched from said first ON state to said first OFF state by said first control signal immediately after said output buffer has been switched from said second OFF state to said second ON state by said second control signal, to set a second time period for which said first and second ON states are simultaneously attained.

7. An input/output buffer circuit comprising:

an input/output line having an input/output terminal at one end, the other end thereof being branched into an input line and an output line;

an input buffer located on said input line for receiving an input signal through an input end thereof;

an output buffer located on said output line for outputting an output signal through an output end thereof;

a latch circuit connected to said input/output line for latching voltages in said input and output signals to hold said voltages at an output end of said latch circuit; and a control terminal receiving a first control signal, wherein said control terminal includes a first control terminal connected to said latch circuit for receiving said first control signal and a second control terminal connected to said output buffer for receiving a second control signal, wherein said latch circuit is responsive to said first control signal inputted thereinto through said control terminal for being switched between a first ON state in which said voltages of said input and output signals are latched by said latch circuit and a first OFF state in which the output end of said latch circuit is in high impedance, and said output buffer is switched by said second control signal between a second ON state in which said output signal is outputted therefrom and a second OFF state in which the output end of said output buffer is in high impedance, wherein said latch circuit is set in said first OFF state by said first control signal when said output buffer is set in said second ON state by said second control signal.

8. The input/output buffer circuit as defined in claim 7, wherein said latch circuit is switched from said first OFF state to said first ON state by said first control signal immediately before said output buffer is switched from said second ON state to said second OFF state by said second control signal, to set a first time period for which said first and second ON states are simultaneously attained, and wherein said latch circuit is switched from said first ON state to said first OFF state by said first control signal immediately before said output buffer is switched from said second OFF state to said second ON state by said second control signal, to set a second time period for which said first and second OFF states are simultaneously attained.

9. The input/output buffer circuit as defined in claim 7,
wherein said latch circuit is switched from said first OFF state to said first ON state by said first control signal immediately before said output buffer is switched from said second ON state to said second OFF state by said second control signal, to set a first time period for which said first and second ON states are simultaneously attained, and wherein said latch circuit is switched from said first ON state to said first OFF state by said first control signal immediately after said output buffer has been switched from said second OFF state to said second ON state by said second control signal, to set a second time period for which said first and second ON states are simultaneously attained.

10. An electronic equipment comprising an input/output buffer circuit and control means for controlling said input/output buffer circuit, said input/output buffer circuit comprising:

an input/output line having an input/output terminal at one end, the other end thereof being branched into an input line and an output line;

an input buffer located on said input line for receiving an input signal through an input end thereof;

an output buffer located on said output line for outputting an output signal through an output end thereof;

a latch circuit connected to said input/output line for latching voltages in said input and output signals to hold said voltages at an output end of said latch circuit; and a control terminal receiving a first control signal, wherein said control terminal includes a first control terminal connected to said latch circuit for receiving said first control signal and a second control terminal connected to said output buffer for receiving a second control signal, wherein said latch circuit is responsive to said first control signal inputted thereinto through said control terminal for being switched between a first ON state in which said voltages of said input and output signals are latched by said latch circuit and a first OFF state in which the output end of said latch circuit is in high impedance, and said output buffer is switched by said second control signal between a second ON state in which said output signal is outputted therefrom and a second OFF state in which the output end of said output buffer is in high impedance, wherein said latch circuit is set in said first OFF state by said first control signal when said output buffer is set in said second ON state by said second control signal.

11. An input/output buffer circuit comprising:

an input/output line having an input/output terminal at one end, the other end thereof being branched into an input line and an output line;

an input buffer located on said input line for receiving an input signal through an input end thereof;

an output buffer located on said output line for outputting an output signal through an output end thereof;

a latch circuit connected to said input/output line for latching voltages in said input and output signals to hold said voltages at an output end of said latch circuit; and a control terminal receiving a first control signal, wherein said control terminal includes a first control terminal connected to said latch circuit for receiving said first control signal and a second control terminal connected to said output buffer for receiving a second control signal, wherein said latch circuit is responsive to said first control signal inputted thereinto through said control terminal for being switched between a first ON state in which said voltages of said input and output signals are latched by said latch circuit and a first OFF state in which the output end of said latch circuit is in high impedance, and said output buffer is switched by said second control signal between a second ON state in which said output signal is outputted therefrom/and a second OFF state in which the output end of said output buffer is in high impedance, wherein said latch circuit is set in said first ON state by said first control signal when said output buffer is set in said second OFF state by said second control signal.

12. The input/output buffer circuit as defined in claim 11, wherein said latch circuit is switched from said first OFF state to said first ON state by said first control signal immediately before said output buffer is switched from said second ON state to said second OFF state by said second control signal, to set a first time period for which said first and second ON states are simultaneously attained, and wherein said latch circuit is switched from said first ON state to said first OFF state by said first control signal immediately before said output buffer is switched from said second OFF state to said second ON state by said second control signal, to set a second time period for which said first and second OFF states are simultaneously attained.

13. The input/output buffer circuit as defined in claim 11, wherein said latch circuit is switched from said first OFF state to said first ON state by said first control signal immediately before said output buffer is switched from said second ON state to said second OFF state by said second control signal, to set a first time period for which said first and second ON states are simultaneously attained, and wherein said latch circuit is switched from said first ON state to said first OFF state by said first control signal immediately after said output buffer has been switched from said second OFF state to said second ON state by said second control signal, to set a second time period for which said first and second ON states are simultaneously attained.

14. An input/output buffer circuit comprising:

an input/output line having an input/output terminal at one end, the other end thereof being branched into an input line and an output line;

an input buffer located on said input line for receiving an input signal through an input end thereof;

an output buffer located on said output line for outputting an output signal through an output end thereof;

a latch circuit connected to said input/output line for latching voltages in said input and output signals to hold said voltages at an output end of said latch circuit, wherein said latch circuit comprises an input inverter having first input and output ends, said first input end being connected to said input/output line, and an output inverter having second input and output ends, said second input end being connected to said first output end of said input inverter, and said second output end being connected to said input/output line as the output end of said latch circuit;

a control terminal receiving a first control signal; and a delay circuit connected between said control terminal and said output buffer, said delay circuit outputting a second control signal to said output buffer later than said first control signal with a given delay time, wherein said latch circuit is responsive to said first control signal inputted thereinto through said control terminal for being switched between a first ON state in which said voltages of said input and output signals are latched by said latch circuit and a first OFF state in which the output end of said latch circuit is in high impedance, and wherein said output buffer is switched by said second control signal between a second ON state in which said output signal is outputted therefrom and a second OFF state in which the output end of said output buffer is in high impedance.

15. The input/output buffer circuit as defined in claim 14, wherein said first control signal is only inputted into said input inverter which is in turn switched by said first control signal between a third ON state in which said input inverter is operable and a third OFF state in which said first output end is in high impedance and wherein said second control signal is inputted to said output buffer and output inverter, said output inverter being switched by said second control signal between a fourth ON state in which said output inverter is operable and a fourth OFF state in which said second output end is in high impedance.

16. The input/output buffer circuit as defined in claim 15, wherein said input inverter is switched from said third OFF state to said third ON state by said first control signal immediately before said output buffer is switched from said second ON state to said second OFF state by said second control signal, to set a first time period for which said second and third ON states are simultaneously attained, and wherein said input inverter is switched from said third ON state to said third OFF state by said first control signal immediately before said output inverter is switched from said fourth ON state to said fourth OFF state by said second control signal, to set a second time period for which said fourth ON state and said third OFF state are simultaneously attained.

17. The input/output buffer circuit as defined in claim 16, wherein said delay circuit delays said second control signal relative to said first control signal with such a delay time that said second time period becomes shorter than said first time period.

18. The input/output buffer circuit as defined in claim 15, wherein said input inverter is switched from said third OFF state to said third ON state by said first control signal immediately before said output buffer is switched from said second ON state to said second OFF state by said second control signal, to set a first time period for which said second and third ON states are simultaneously attained, and wherein said output inverter is switched from said fourth ON state to said fourth OFF state by said first control signal substantially at the same time when said output buffer has been switched from said second OFF state to said second ON state by said second control signal, to set a second time period for which said second ON state and said fourth OFF states are simultaneously attained.

* * * * *